United States Patent [19]

Goedicke et al.

[11] Patent Number: 5,614,273

[45] Date of Patent: Mar. 25, 1997

[54] PROCESS AND APPARATUS FOR PLASMA-ACTIVATED ELECTRON BEAM VAPORIZATION

[75] Inventors: Klaus Goedicke; Bert Scheffel; Jonathan Reschke; Siegfried Schiller; Volker Kirchhoff; Torsten Werner, all of Dresden, Germany

[73] Assignee: Fraunhofer-Gesellschaft zur Foerderung der angewandten Forschung, e.V., Munich, Germany

[21] Appl. No.: 639,620

[22] Filed: Apr. 29, 1996

[63] Continuation of PCT/DE94/01207, Oct. 11, 1994.

[30] Foreign Application Priority Data

Oct. 27, 1993 [DE] Germany .......................... 43 36 681.3

[51] Int. Cl.$^6$ ................................................. H05H 1/24
[52] U.S. Cl. .................. 427/569; 118/50.1; 118/620; 118/723 E; 118/723 EB; 118/723 FE; 427/248.1; 427/294; 427/580; 427/585; 427/595
[58] Field of Search .................................. 427/569, 580, 427/585, 595, 248.1, 294; 118/723 EB, 723 FE, 723 E, 726, 50.1, 620

[56] References Cited

U.S. PATENT DOCUMENTS 3,791,852  2/1974  Bunshah ................................. 427/567
4,673,477  6/1987  Ramalingam et al. ............ 204/192.38
5,227,203  7/1993  Kibe et al. .............................. 427/523

FOREIGN PATENT DOCUMENTS 0384617  8/1990  European Pat. Off. .
3206882  10/1982  Germany .
3413891  10/1985  Germany .
3110238  8/1986  Germany .
3627151  2/1988  Germany .
4006456  5/1991  Germany .
4007523  9/1991  Germany .

OTHER PUBLICATIONS

Japanese Absract No. 63–20465, vol. 12, No. 223 (C–507), Jan. 28, 1988.

*Primary Examiner*—Bernard Pianalto
*Attorney, Agent, or Firm*—Evenson, McKeown, Edwards & Lenahan, P.L.L.C.

[57] ABSTRACT

A process and apparatus for plasma-activated electron beam vaporization is provided. The vaporizing material from at least two vaporizer crucibles is vaporized with electron beams. An electric voltage is applied to the vaporizer crucibles in such a way that the vapor-emitting areas serve as electrodes of an electric discharge. The vaporizing material acts as a cathode or anode. The process and apparatus are preferably intended for the reactive coating of large surfaces and for the reactive coating of components, tools and strip steel.

15 Claims, 3 Drawing Sheets

PROCESS AND APPARATUS FOR PLASMA-ACTIVATED ELECTRON BEAM VAPORIZATION

CROSS-REFERENCE TO RELATED APPLICATIONS

This application is a continuation of PCT Application No. PCT/DE94/01207 filed on Oct. 11, 1994.

BACKGROUND AND SUMMARY OF THE INVENTION

The invention relates to a process for vaporizing or evaporating material in a vacuum from two or more crucibles using an electron beam. The invention further relates to an apparatus for performing the process. The process is preferably suitable for coating large surfaces and is in particular used for the reactive coating of components, tools and strip steel.

In electron beam vaporization, a high energy electron beam is deflected and focussed by electric or magnetic fields and is directly directed onto the surface of the material to be vaporized. A decisive advantage of electron beam vaporization is that the vapor-emitting surface is directly heated without the energy supply occurring over the crucible or the vaporizing material. This also permits the use of water-cooled copper crucibles, so as to prevent reactions between the crucible wall and the vaporizing material. Another important reason for using this process is the good positional and time controllability of the electron beam, which makes possible the use of large-surface vaporizer crucibles. Maximum vaporization rates are attained with correspondingly powerful electron beam guns of the axial type.

it is known for the deposition of mixed and alloy coatings, to simultaneously vaporize from two or more crucibles filled with different materials. The vaporization rates from the individual crucibles are so adjusted by the control of the beam mower and deflection, that coatings with the necessary coating composition are deposited. The crucibles are subject to the plasma action in a mime alternating manner of one or more electron guns. Several vaporizer crucibles are also used for coating very large substrate surfaces and for coating at very high coating rates in the case of a limited vaporization rate for each crucible A disadvantage of electron beam vaporization is in the relatively low proportion of excited and ionized particles and is the low energy of the vaporized particles. The reason for this is the relatively low temperature at the vapor-emitting surface. Another reason is that the action cross-section for the collision between the high energy beam electrons and the vapor particles or droplets and, therefore, the ionization probability in the vapor is very low. Important prerequisites for the deposition of high quality, dense coatings, particularly at a low substrate temperature and for producing ionization level of the vapor.

Numerous processes are known for the plasma-assisted deposition of coatings, which avoid the aforementioned disadvantages. One of the best known s ion-assisted reactive vaporization, in which the stray and secondary electrons produced on the melting bath surface by the primary, high energy electron beam are accelerated by an additional electrode. The electrode is applied to a low positive potential (20 to 100 V) and is so positioned in the vaporization zone that on the oath of the electrons to the anode there is a maximum number of collisions between electrons, vapor and reactive gas particles. Thus, a discharge forms and an ion current reaches the substrate. The energy of the positively ionized particles or droplets can be additionally increased by a negative bias voltage applied to tie substrate (U.S. Pat. No. 3,791,852). However, this process has not hitherto been adopted technically, because tests to utilize the process on a large scale through using large vaporizer crucibles with high vaporizing rates have failed. A main reason for this failure is the comparatively low ion current density an the substrate.

In addition, an apparatus is known which is intended to improve the afore-mentioned principle of being able to deposit stoichiometric coatings of chemical compounds at higher coating rates. This apparatus is characterized in that the vaporizer crucible is surrounded by a chamber, which in the direction of the substrate has an aperture. Outside the chamber there is a positively biased electrode. The electrode sucks the charge carriers produced in the inner chamber. A glow discharge burning in the vicinity of the aperture and the electrode is produced as disclosed in German Patent document DE 36 27 151 A1. The disadvantages of the process are that the reactive gas is introduced into the inner chamber and an increased pressure occurs there. However, the interact ions sought between the electron beam and the reactive gas lead to a strong spread of the electron beam at the higher coating rates and the consequently necessary higher gas quantities. The degree of ionization attainable with this arrangement is too low for many reactive coating processes. In addition, a large proportion of vaporized material is deposited in an unused form on the inner chamber wall.

In order to eliminate these deficiencies, effective electron sources have been developed which operate with low accelerating voltages. These include low voltage arc vaporizers and hollow cathode electron beam vaporizers with a healed or cold cathode. Characteristics of this process are the construction of the crucible as an anode of an electric discharge and the introduction of a working gas (e.g. argon) into a separate cathode chamber. As a low gas pressure is required in the coating chamber, pressure stages must be arranged between the cathode and mine coating chamber. For this purpose, a process for vaporizing metals is described in German Patent document DE 28 23 876 C2, in which an electron beam of a transverse vaporizer and a low voltage arc are directed onto the crucible acting as the anode. Thus compared with the individual processes, the vaporization rate and ionization or excitation can be see independently of one another. The plasma activation is very intense in these processes, with are technically established and in practice give coatings with good characteristics. However, with said processes coating rates above 1 µm/s have not been obtained. The transfer of these processes to more extensive crucibles for the coating of large surfaces has not hitherto been implemented.

It is also known to use vacuum arc vaporizers, also called arc vaporizers, for coating functions (DE 31 52 786; U.S. Pat No. 4,673,477; DE 40 06 456). An arc is ignited on the arc vaporizer cathode. The arc burns in the self-produced vapor between the cathode and the anode, the discharge being contracted on the cathode side in so-called cathode spots with very high current densities ($j=10^5 \ldots 10^8$ A/cm$^2$). The cathode spot in which melting and vaporization of the target material takes place moves stochastically and suddenly over the cathode surface. The average drift rate and the direction of this movement are influenced by the target material, the arc current, external magnetic fields and the presence of additionally introduced gases. The decisive advantage of this process is the very high degree of ionization of the vapor cloud produced (10 to 90%) with a high proportion of multiple ionized particles. Coatings applied with this process are very dense and have a high adhesive strength.

However, these advantages are greatly reduced in many applications by the undesired incorporation of numerous microparticles with a size up to about 50 µm, i.e. so-called droplets. These droplets are centrifuged out due to the nigh current density in the melting craters on the cathode surface. The frequency and size of these droplets can be reduced by various measures. These include methods for the subsequent filtering of the droplets by using magnetic or electric deflection fields for charged particles. The restriction of the high intrinsic dynamics of the cathode arc foot or root by magnetic fields for the uniform removal of the target surface also suppresses or avoids the droplets. The same is achieved by an electron beam for guiding and stabilizing the cathode root. The arc discharge is operated in a range in which a considerable par of the arc current flows through no spots on the target surface and the target serves as the cathode. The electron beam produces a local vapor cloud over the target. The cathode root is concentrated in the local vapor cloud and can be guided over the target surface by the deflection of the laser or electron beam.

The aforementioned arc vaporization processes do not bring about a complete prevention of droplet formation and do not significantly increase the vaporization rate. For maintaining the electric discharge for plasma activation, additional electrodes are required, which in the case of a reactive process control become unusable by coverage with insulating coatings. In addition, part of the electric power of the discharge is lost in these electrodes.

Finally, an arc discharge for coating purposes is also known from German Patent document DE 34 13 891 C2, in which the anode is constructed as a thermally insulated crucible and heated with the electron current of an arc burning on a separate, cold cathode. The arc of the so-called anode spot is concentrated on the hot vaporization material of the anode and leads to its intense vaporization, excitation and ionization. The arc mainly burns in the vapor of the anodic vaporization material. This arc vaporization form admittedly avoids the formation of droplets, but the disadvantages are the lower ionization of the vapor, the difficulty of separating the simultaneously formed anode and cathode vapors and the necessary energy consumption for vaporizing cathode material, which does not contribute to the coating formation.

A process for vaporizing material in vacuo is also known from German Patent document DE 32 06 882 A1, in which the material to be vaporized is subject to the action of high energy electron beams in the vaporizer crucible and simultaneously the material is bombarded with electrons from a low voltage arc discharge between a cathode and an anode in the vaporizing chamber. This process admittedly eliminates certain deficiencies of the known processes, but the coating rate is too low in the case of intense plasma action for the coating of large substrate surfaces. This deficiency is also due to the fact that the energy of the deposited particles is inadequately controllable, which ultimately reduces the quality of the coating applied.

The problem of the invention is to provide a process for the plasma-activated electron beam vaporization and the apparatus for performing the process for obtaining a very high coating rate in the case of intense plasma action. A high ionization and excitation level of the vapor produced is to be made possible and the spectrum of depositable materials is to be very large. The process is, in particular, to permit a reactive process control, also for the deposition of electrically insulating coatings. No additional electrodes are to be used which, during the coating process, become covered with insulating coatings and therefore are rendered inactive. The process is to have a high efficiency with regards to the converted electric power. The coating of large substrate surfaces is to be made possible by large vaporizer surfaces and the coating rates, ion current density at the substrate and average energy of the deposited particles are to be easily controllable.

According to the present invention, these problems are solved by the process for plasma-activated electron beam vaporization, wherein vaporizing material from at least two vaporizer crucibles is vaporized by the action of electron beams. An electrical voltage is applied to the vaporizer crucibles so that the electron beam-heated and vapor-emitting areas of the vaporizing material act as electrodes of an electric discharge and the vaporizing material of at least one vaporizer crucible is connected as the cathode and the vaporizing material of at least one further vaporizer crucible is connected as the anode. An apparatus for performing the process includes a vacuum chamber with at least two vaporizer crucibles located therein, at least one electron gun positioned on the vacuum chamber and at least one magnet system for deflecting the electron beam. The vaporizer crucibles are individually connected by clearly defined ohmic resistors with the vacuum chamber, which is at ground potential. The vaporizing material is contacted by the crucible wall or by additional electrodes in the vaporizer crucibles. The spacing of the crucibles is chosen in such a way that their vapor clouds penetrate.

The process according to the invention utilizes the special features of this electric discharge which gives rise to the advantages of the process. The discharge burns in the vapor of the vaporizing material and is therefore directly used for vapor activation. No additional process gas is required for maintaining the discharge. Therefore, the process is particularly suitable for the plasma-assisted deposition of very pure coatings. It can be appropriate for certain applications to introduce into the vaporizing zone, up to a specific pressure, additional inert gas, preferably argon, so that the discharge conditions and coating formation are influenced. This process is also highly suitable for reactive process control. In this case, in a known manner a reactive gas (e.g. $N_2$, $O_2$) is introduced into the containers. The arc discharge produces such a high plasma density, that to an increasing extent there are reactions between the reactive gas particles and deposited vapor particles, both on the substrate and in the vaporizing zone. Stoichiometric coatings can be deposited if the vaporization rate and the reactive gas intake are appropriately matched to one another. These coatings of chemical compounds, which are naturally also deposited on all other surfaces in the vaporizing chamber, can be electrically insulating (e.g. oxidic). Such insulating coatings cannot impair the described discharge form, because both electrodes are hot and give off vapor and through the electron beam and discharge are themselves permanently kept free. The problem of electrode contamination during the process, which leads to an interruption of the latter, does not occur in the process according to the invention.

Another advantage is that the entire electric power of the arc discharge is utilized in the process. For the electrical discharge, only electrodes are acting which are directly participating in the vaporization and plasma activation process. Both the cathodic and anodic arc deposit are concentrated on the hot and vaporizing areas of the vaporization material surface. Thermal energy passing through the electrode-near processes into the anode or cathode, consequently leads to an even more intense vaporization of the electrodes. The proportion of the electric power of the arc discharge, which is transformed in the plasma zone, maintains the ionization and excitation processes in the vapor.

The process leads to the deposition of droplet-free, dense coatings. The droplet emission of arc discharges is closely linked with cathode mechanisms with very high densities. Through specific operating conditions, which are linked with a very high vapor density and high cathode temperature, the formation of cathode spots can be prevented. Thus, an intense plasma uniformly distributed over the hot, vaporizing parts of the cathode surface is formed. The arc deposit in the vicinity of the cathode has in this case a diffuse character, linked with the relatively low current densities (j=10 . . . 1000 A/cm$^2$). The process according to the invention is largely able to avoid the transient phenomena otherwise typical for vacuum arc discharges such as stochastic cathode spot movement, frequent extinguishing of the discharge, strong fluctuations of the burning voltage and plasma intensity.

Other special advantages of the process are linked with the fact that electron beam can be very rapidly deflected and within certain limits can make random linear and flat figures on the vaporizing material, which form the base or root area for the diffuse arc. In order to obtain a specific power density, the electron beam can be focussed or unfocussed. Therefore, the location and the surface and, consequently, the current density of the cathodic deposit of the diffuse arc discharge, can be controlled. It is in particular possible to produce plasma areas extending over large surfaces, whereas the problem of surface-extended plasma sources has hitherto been mainly solved by a lining up of several individual plasma sources with associated, separate power supplies. The process surprisingly makes it possible to divide up the arc on the cathode surface into several spatially separate areas, in that the electron beam permits the heating of different areas of the surface in succession, but to a limited extent in a quasi-simultaneous form due to a high alternating frequency. Several different areas can also be heated through electron beam deflection on anodically acting vaporizing material. Therefore, spatially extended, large vaporizer crucibles can also be used for coating large-surface substrates. Several separate areas on the surface of the vaporizing material can be activated by a single vaporizer system (electron gun with deflecting system) and a joint plasma-power supply system.

For the vaporizing of metals and alloys or for depositing chemical compounds by means of the reactive vaporization of a metal, the vaporizer crucibles are filled with the same vaporizing material. For the deposition of mixed or alloy coatings by co-evaporation or co-vaporization, the participating vaporizer crucibles are filled with different vaporizing materials. Through the independent setting of the electron beam power, deflection and focussing for each of the participating crucibles, the coating composition can be influenced in a planned manner. In the case of a corresponding vapor density, the electric discharge can also be operated over the penetrating vapor clouds of different materials.

The anodic and cathodic processes make different contributions to plasma activation and vaporization. In most materials, the more intense plasma production takes place in the vicinity of the cathode. An advantageous development of the process more particularly involves each vaporizer crucible being alternately switched as an anode or cathode. In alternating voltage operation the advantage is obtained that in each case participating vaporizer crucibles act in a time-averaging similar manner. The vaporizer crucibles participate to the same extent in the plasma action processes, which is particularly important when vaporizing from several vaporizer crucibles filled with different materials. Compared with the direct current variant of the process, in alternating voltage operation there is also a symmetrical plasma distribution in the vaporizing chamber between the vaporizer crucibles. In the simplest case, a sinusoidal alternating voltage is applied between two vaporizer crucibles. The arc current supply is preferably in the form of a bipolar pulse current supply. Therefore, it is possible to obtain random pulse shapes, pulse amplitudes and different pulse lengths and intervals for positive and negative polarity. This gives the possibility of setting vaporization parameters (vaporizing rates by electron beam power, focussing and deflection) and plasma parameters (degree of ionization and excitation by arc discharge) substantially independently of one another. This takes place separately for each vaporizer crucible and in this way the energy and reaction kinetic conditions of the particular coating process can be adapted.

For increasing the energy of the ions encountering the substrate, in a manner known per se, a negative bias voltage relative to the vaporizer crucibles is applied to the substrate. With very large substrate surfaces, the resulting bias current can reach e.g. 100 A. Under certain conditions charging can lead to the current to the substrate being spontaneously constricted to an arc discharge with cathode spots on the substrate. To avoid such phenomena or immediately quench the resulting arcs, the bias current supply is also in pulse form. If the discharge is with alternating current between the crucibles, then it is appropriate to operate the bias voltage with double the frequency of that of the alternating current discharge with time-synchronous zero passages or crossings of both voltages.

other objects, advantages and novel features of the present invention will become apparent from the following detailed description of the invention when considered in conjunction with the accompanying drawings.

DETAILED DESCRIPTION OF THE DRAWINGS

Figure 1:
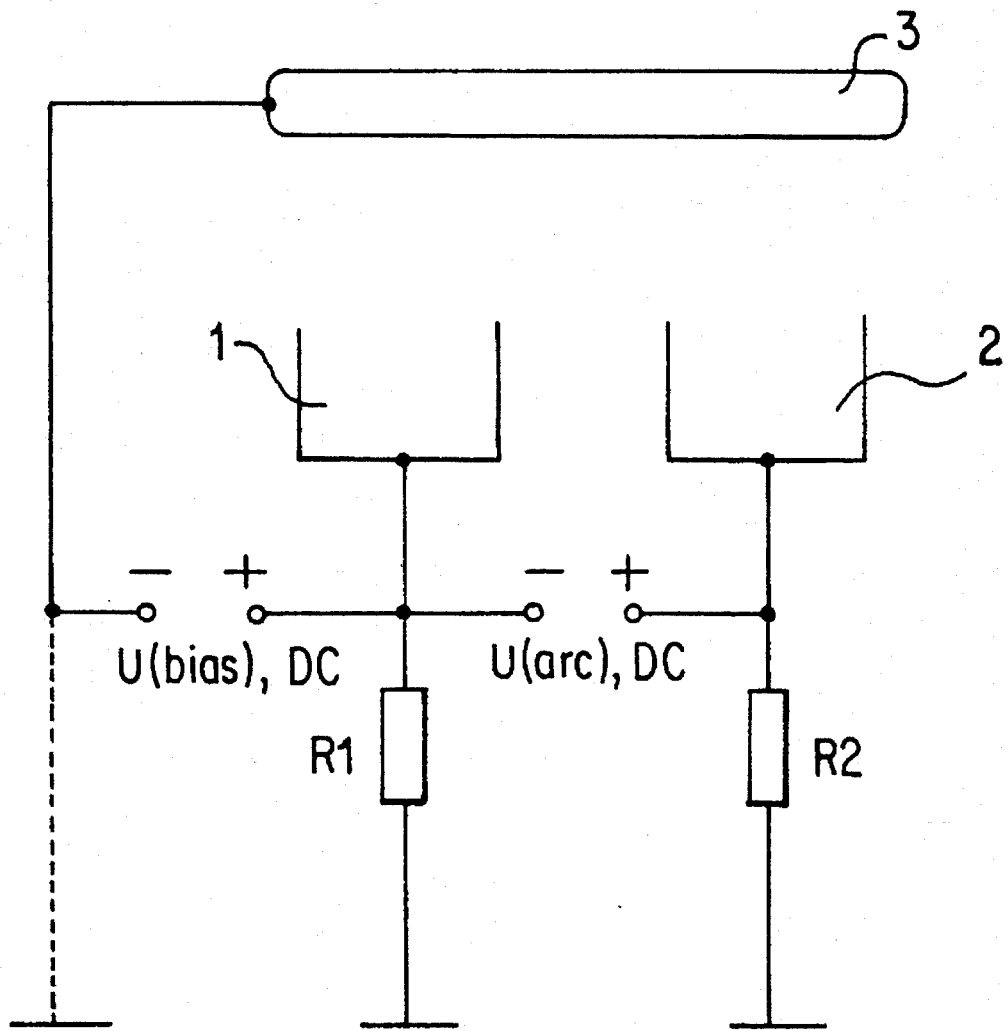
FIG. 1 is a schematic block diagram of the process according to the present invention.

FIG. 1 shows the simplest variant of the process. By plasma-assisted deposition, a dense, corrosion-resistant titanium coating is to be produced on a steel sheet with a direct current discharge. Use is made of two vaporizer crucibles 1, 2, which are filled with Ti as the vaporizing material. The electron beam (100 kW at 40 kV) alternately heats the vaporizing material of vaporizer crucible 1 and 2 with a residence time of, in each case, 20 ms. Through a rapid sweep of the two vaporizer crucibles 1, 2, the electron beam covers a surface area of, in each case, approximately 30 cm$^2$. The crucibles 1, 2 are connected to ground potential by the resistors R1 and R2 and are used for diverting the electron beam current.

The magnitude of the resistors R1 and R2 must fulfill two conditions. Firstly, the voltage drop occurring at the resistor through the derived electron beam current I(ES) must be small compared with the electron beam accelerating current U(ES), i.e. R1=R2<<U(ES)I(ES). Secondly, the current loss through the resistors R1 and R2 occurring after applying the arc voltage U(arc) at the vaporizer crucibles 1, 2 must be small compared with the arc current I(arc), i.e. (R1+R2)>>U(arc)/I(arc). The magnitude of the resistors R1, R2 was chosen in each case as 20 Ω. The arc direct voltage U(arc) with the negative pole is applied to the vaporizer crucible 1 between the crucibles 1, 2. The vaporizer crucible 1 serves as cathode and the vaporizer crucible 2 as an anode of the discharge. Between the crucible 1 and the substrate 3, the bias voltage U(bias) with the negative pole is at the substrate 3, i.e. the steel plate. Compared with the vaporizer crucible 1, the bias voltage of the substrate 3 is increased by the arc voltage U(arc). If desired, the substrate 3 can be applied to ground potential (broken line). The arc discharge is at a current intensity of 600 A and has on the cathode side a diffuse arc deposit on a surface of approximately 30 cm and only burns in titanium vapor. The substrate 3 is moved at a distance of 30 cm over the vaporizing zone and a tight, well adhering titanium coating is obtained.

Figure 2:
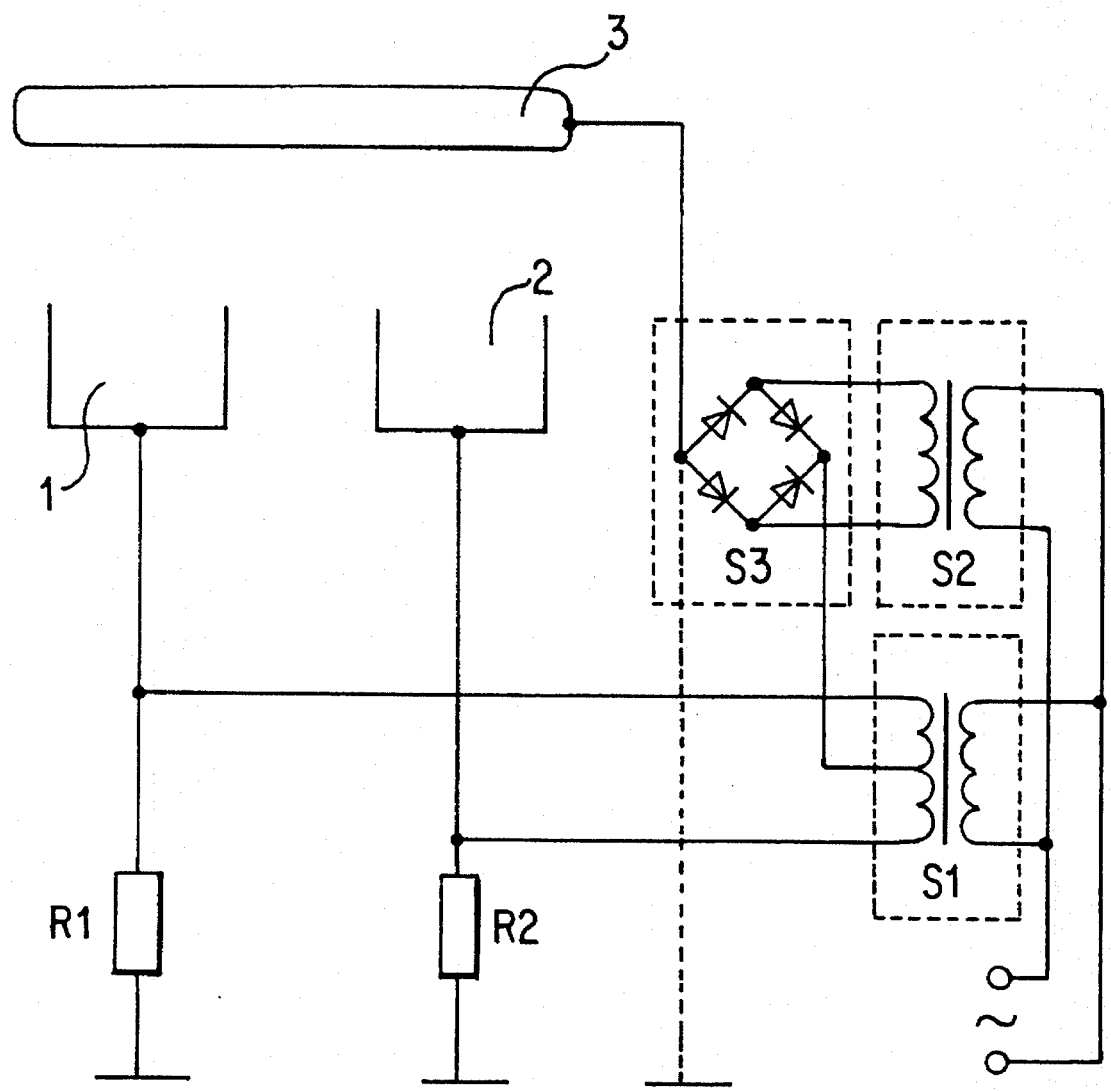
FIG. 2 is a schematic diagram illustrating a process variant for the plasma-assisted deposition of titanium oxide coatings on steel sheeting using a discharge supplied with a sinusoidal alternating current.

FIG. 2 is used for explaining a process variant for the plasma-assisted deposition of titanium oxide coatings on steel sheeting using a discharge supplied with a sinusoidal alternating current. Two vaporizer crucibles 1, 2 are filled with titanium. The electron beam alternately heats the vaporizing material of crucible 1 and 2 with a residence time of in each case 10 ms by a rapid sweeping of a surface area of approximately 30 cm². The two vaporizer crucibles, 1, 2 are connected across the resistors R1 and R2 to ground potential and are used for diverting the electron beam current. The resistors R1 and R2 are dimensioned as discussed above for FIG. 1. The power supply unit S1 transfers a sinusoidal alternating voltage to the vaporizer crucibles 1 and 2. Therefore, with a frequency of the sinusoidal voltage of 1000 Hz, they alternately serve as an anode or cathode for the arc discharge. The bias voltage is in pulsed form through the power supply units S2 and S3. The supply voltage is the same alternating voltage as used for supplying the arc current supply S1. It is transformed with the power supply unit S2 and rectified with the power supply unit S3. The resulting sine half-wave pulses (negative polarity at the substrate) with double the frequency compared with the input signal voltage are switched to the center tap of the output transformer of the power supply unit S1. This circuit arrangement has the advantage that bias pulse voltage and arc alternating voltage are precisely synchronized with one another, i.e. the zero values of the bias and arc voltage coincide in time. For assisting the discharge, argon is introduced into the vaporizing zone at a pressure of approximately 0.2 Pa. The arc discharge takes place at a current intensity of 600 A and has a diffuse deposit on the vaporizing material of both crucibles 1, 2. In addition, oxygen is introduced into the vaporizing zone up to a total pressure of 1 Pa, which leads to a stoichiometric titanium oxide coating on the substrate 3.

Figure 3:
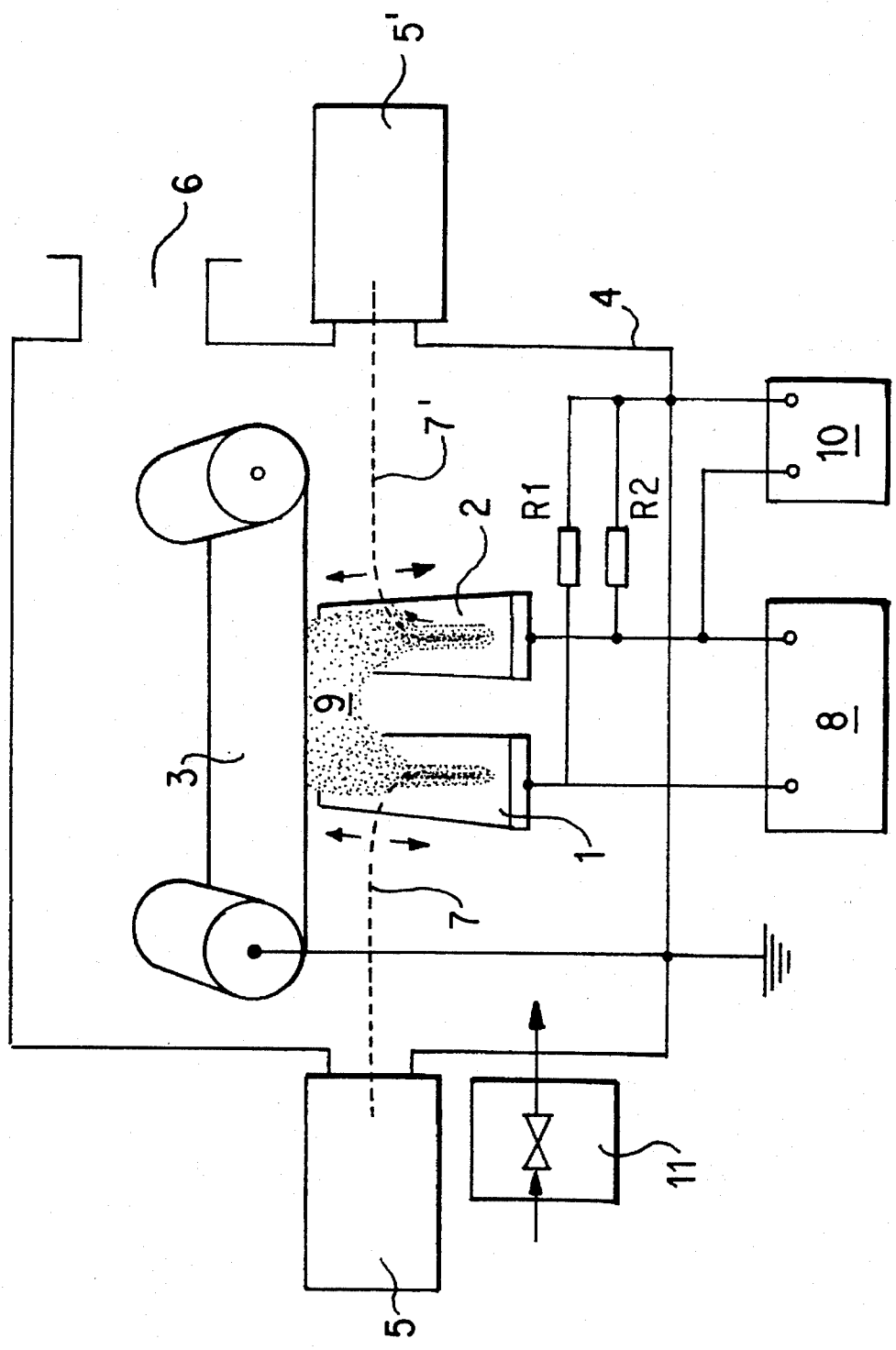
FIG. 3 is a schematic block diagram of an apparatus for performing the process according to the present invention.

Referring to FIG. 3, an apparatus for coating strip steel (substrate 3) with titanium oxide from two large, rectangular vaporizer crucibles is explained. Two electron guns 5, 5' are flangedly connected to a container 4 evacuated by means of the vacuum pump connection 6 to a pressure of $10^{-3}$ Pa. The electron guns 5, 5' in each case heat one of two water-cooled vaporizer crucibles 1, 2 having dimensions of 500×200 mm with an electron gun power of in each case 200 kW. Two not shown, independent magnet systems produce static magnetic fields, which deflect the horizontally fired in electron beam 7, 7' onto the crucibles. Deflection systems in the electron guns 5, 5' permit the programmed deflection of the electron beam 7, 7' over the entire crucible length. The vaporizer crucibles 1, 2 are connected to ground potential across the ohmic resistors R1, R2. An alternating pulse voltage of 100 Hz, supplied by the power supply '3, is applied between the crucibles 1, 2. At a distance of 5 cm, the vaporizer crucibles 1, 2 are sufficiently closely juxtaposed to bring about penetration of their vapor clouds. Without any additional igniting device and without introducing a process gas, a powerful current arc discharge is ignited and is operated at a burning voltage of approximately 50 V and a current intensity of 2000 A. An intense illuminating, diffuse plasma 9 is uniformly formed over the two crucibles 1, 2 and fills the vaporizing chamber between the crucible plane and the 40 cm higher substrate plane. A pulsed bias voltage with an amplitude of 300 V, supplied by the power supply 10, is applied between one of the vaporizer crucibles 1, 2 and the substrate 3. This bias voltage, which is positive compared with the ground, has twice the frequency of the arc alternating voltage. By means of the gas introduction system 11, oxygen is introduced into the vaporizing zone. The substrate 3 is at ground potential and is bombarded with energy-rich ions and neutral particles from the vaporizing zone, which react with the oxygen particles and form a dense titanium oxide coating on the substrate 3.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A process for plasma-activated electron beam vaporization of a vaporizing material from at least two vaporizer crucibles via the action of electron beams, the process comprising the steps of:

applying an electrical voltage to the at least two vaporizer crucibles such that an electron beam-heated and vapor-emitting areas of the vaporizing material operate as electrodes of an electric discharge;

connecting the vaporizing material of at least one of the at least two vaporizer crucibles as a cathode and at least one further vaporizer crucible of said at least two vaporizer crucibles as an anode.

2. The process according to claim 1, further comprising the step of applying an alternating voltage having a random pulse shape to the vaporizing material of the at least two vaporizer crucibles as a discharge voltage such that the cathode and the anode are constantly alternated.

3. The process according to claim 2, further comprising the step of separately controlling a pulse amplitude, a pulse shape and duration, and pulse interval times of the applied alternating voltage for each polarity of the random pulses.

4. The process according to claim 1, further comprising the step of setting an energy density on the vaporizing material sufficiently high such that the electric discharge is an arc discharge having diffuse cathode deposit without cathode spots.

5. The process according to claim 1, further comprising the step of deflecting the electron beams in a programmed manner onto the vaporizing material within the vaporizer crucible such that several quasi-simultaneously heated areas are formed on the vaporizing material and such that part of a discharge current flows over each of the several quasi-simultaneously heated areas.

6. The process according to claim 1, wherein an inert gas is introduced into a discharge space for assisting the electric discharge.

7. The process according to claim 6, wherein said inert gas is argon.

8. The process according to claim 1, wherein the at least two vaporizing crucibles are filled with the same or different vaporizing materials.

9. The process according to claim 1, wherein a reactive gas is introduced during the vaporizing process for producing chemical compounds.

10. The process according to claim 1, further comprising the step of setting a ratio of an electric power of the electron beams to a power of the electric discharge in a freely selectable manner.

11. The process according to claim 1, wherein a freely selectable potential is applied to the substrate to be coated.

12. The process according to claim 11, wherein with respect to the at least two vaporizer crucibles, a negative direct voltage is applied to the substrate.

13. The process according to claim 11, wherein with respect to the at least two vaporizer crucibles, a pulsed, negative direct voltage having an adjustable pulse shape, amplitude, duration and interval time is applied to the substrate.

14. The process according to claim 1, wherein a discharge alternating voltage and a pulsed substrate voltage are synchronized to identical time zero crossings and a frequency of the pulsed substrate voltage is set twice as high as a frequency of the discharge alternating voltage.

15. An apparatus for performing plasma-activated electron beam vaporization processes, the apparatus comprising:

a vacuum chamber having at least two vaporizer crucibles located therein;

at least one electron gun positioned on the vacuum chamber;

at least one magnetic system for deflecting an electron beam from the at least one electron gun;

at least two ohmic resistors, each of said at least two vaporizer crucibles being individually connected through one of said ohmic resistors with the vacuum chamber, said vacuum chamber being at ground potential;

wherein a vaporizing material is contacted via one of a crucible wall and additional electrodes in the at least two vaporizer crucibles; and wherein a spacing of the at least two vaporizer crucibles is preselected such that vapor clouds formed during the vaporization process penetrate a substrate to be coated.

* * * * *